United States Patent [19]

Steele

[11] Patent Number: 4,763,008
[45] Date of Patent: Aug. 9, 1988

[54] IONIZATION DETECTOR WITH CONDUCTIVE SIGNAL AND GROUND TRACES

[75] Inventor: Douglas S. Steele, West Chester, Ohio

[73] Assignee: General Electric Company, Cincinnati, Ohio

[21] Appl. No.: 892,969

[22] Filed: Aug. 4, 1986

Related U.S. Application Data

[63] Continuation-in-part of Ser. No. 565,670, Dec. 27, 1983.

[51] Int. Cl.⁴ ............... G01T 1/185; H01J 47/02
[52] U.S. Cl. ..................... 250/385.1; 250/374
[58] Field of Search .................... 250/374, 385

[56] References Cited

U.S. PATENT DOCUMENTS

| | | | |
|---|---|---|---|
| 3,778,614 | 12/1973 | Hounsfield | 250/362 |
| 3,924,129 | 12/1975 | LeMay | 250/336 |
| 4,031,396 | 6/1977 | Whetten et al. | 250/385 |
| 4,119,853 | 10/1978 | Shelley et al. | 250/385 |
| 4,123,657 | 10/1978 | Krippner et al. | 250/385 |
| 4,161,655 | 7/1979 | Cotic et al. | 250/385 |
| 4,260,891 | 4/1981 | Williams | 250/385 |
| 4,264,816 | 4/1981 | Walenta | 250/374 |
| 4,306,155 | 12/1981 | Cotic | 250/385 |
| 4,488,781 | 12/1984 | Giglia | 350/357 |
| 4,491,734 | 1/1985 | Yamaguchi et al. | 250/385.1 |
| 4,570,071 | 2/1986 | Sippel et al. | 250/385 |
| 4,629,897 | 12/1986 | Lemonnier et al. | 250/385.1 |
| 4,645,934 | 2/1987 | Allemond et al. | 250/385.1 |

Primary Examiner—Janice A. Howell
Attorney, Agent, or Firm—Nathan D. Herkamp; Derek P. Lawrence

[57] ABSTRACT

An ionization detector comprises a substrate having detector traces adjacent conductive grounded traces to minimize crosstalk and charge leakage between the detector traces and to reduce the effects of contamination and humidity.

26 Claims, 5 Drawing Sheets

IONIZATION DETECTOR WITH CONDUCTIVE SIGNAL AND GROUND TRACES

This is a continuation-in-part of U.S. patent application Ser. No. 565,670, filed Dec. 27, 1983.

FIELD OF THE INVENTION

The invention relates to the isolation of adjacent conductive elements deposited on a substrate. More specifically, the invention relates to the isolation of conductive traces used in an ionization detector.

BACKGROUND OF THE INVENTION

A beam of electromagnetic energy, such as a beam of X-rays, is passed through objects, such as manufactured parts used in gas turbine engines. An ionization detector is responsive to the electromagnetic energy passing through the object to inspect it for flaws and departures from specifications. The ionization detector has one or more dielectric substrates having closely spaced conductive detector traces carrying small signals produced in response to ionization of a gaseous dielectric by the electromagnetic energy passing through the inspected object. Those signals are on the order of pico-amperes and micro-volts. Electrical crosstalk and charge leakage distort small signals carried by closely spaced conductive traces, especially in a charge-based system such as an ionization detector. Contamination and humidity also distort those signals. Inspection systems can thus produce distorted images of the inspected parts. Therefore, a need exists for a means to minimize such distortion in an ionization detector used in an object inspection apparatus.

SUMMARY OF THE INVENTION

The invention relates to an ionization detector having a substrate with one or more conductive detector elements. At least one grounded element is located adjacent at least one of the detector elements. For example, the ionization detector can have a series of detector elements spaced on the substrate and grounded elements in the spaces between the detector elements. The ionization detector can also include detector elements which are surrounded by grounded elements.

DETAILED DESCRIPTION OF THE INVENTION

Figure 1:
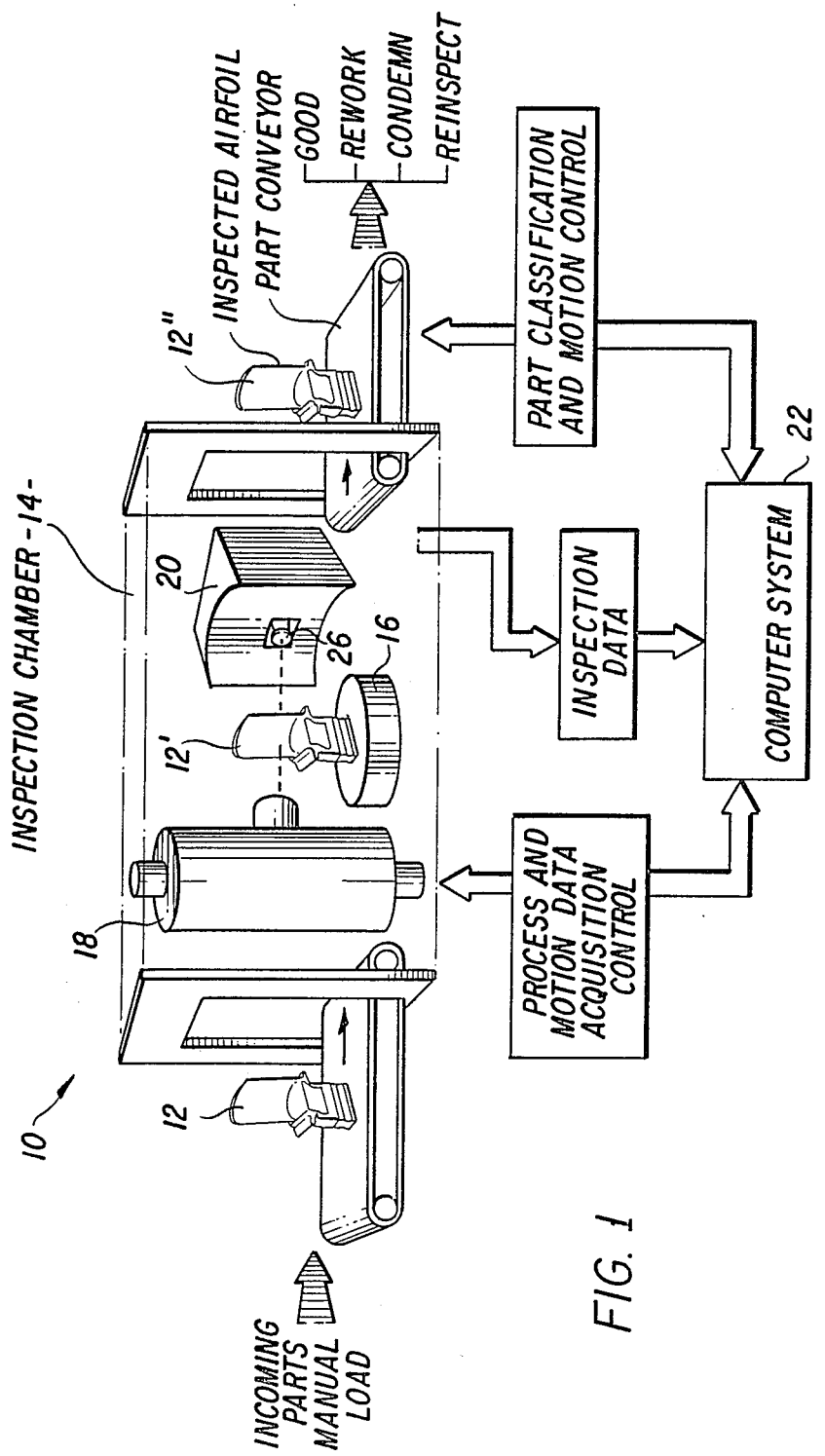
FIG. 1 shows an object inspection system.

FIG. 1 shows an object inspection system 10. An example of such an inspection system is described in more detail in U.S. patent application Ser. No. 832,511 of Steele et al. filed Feb. 25, 1986. A part 12, such as a turbine blade, is conveyed into an inspection chamber 14, where it is examined for flaws and departures from specifications. The part (referred to as 12' inside the chamber) is positioned on a fixture 16 connected to a part manipulator that raises, lowers, and rotates the part 12' during examination. An electromagnetic energy source 18 transmits high energy X-rays, for example, through the part toward an ionization detector 20, such as a line array high pressure xenon detector. An example of such a detector is described in Sippel et al. U.S. Pat. No. 4,570,071. The ionization detector 20 receives the electromagnetic energy passing through the part which varies in intensity according to the composition and stucture of the part. The ionization detector produces signals related to the intensity of the electromagnetic energy, thus creating inspection data related to the part. The inspection data is sent to a computer system 22 for construction of a visual image of the part. The computer system 22 also regulates the operation of the X-ray source 18 and the part manipulator 16. Once a part has been examined for flaws, the part (referred to outside the chamber after inspection as 12") is classified by the computer system 22 and is conveyed out of the inspection chamber 14 for disposition in accordance with its classification.

Figure 2:
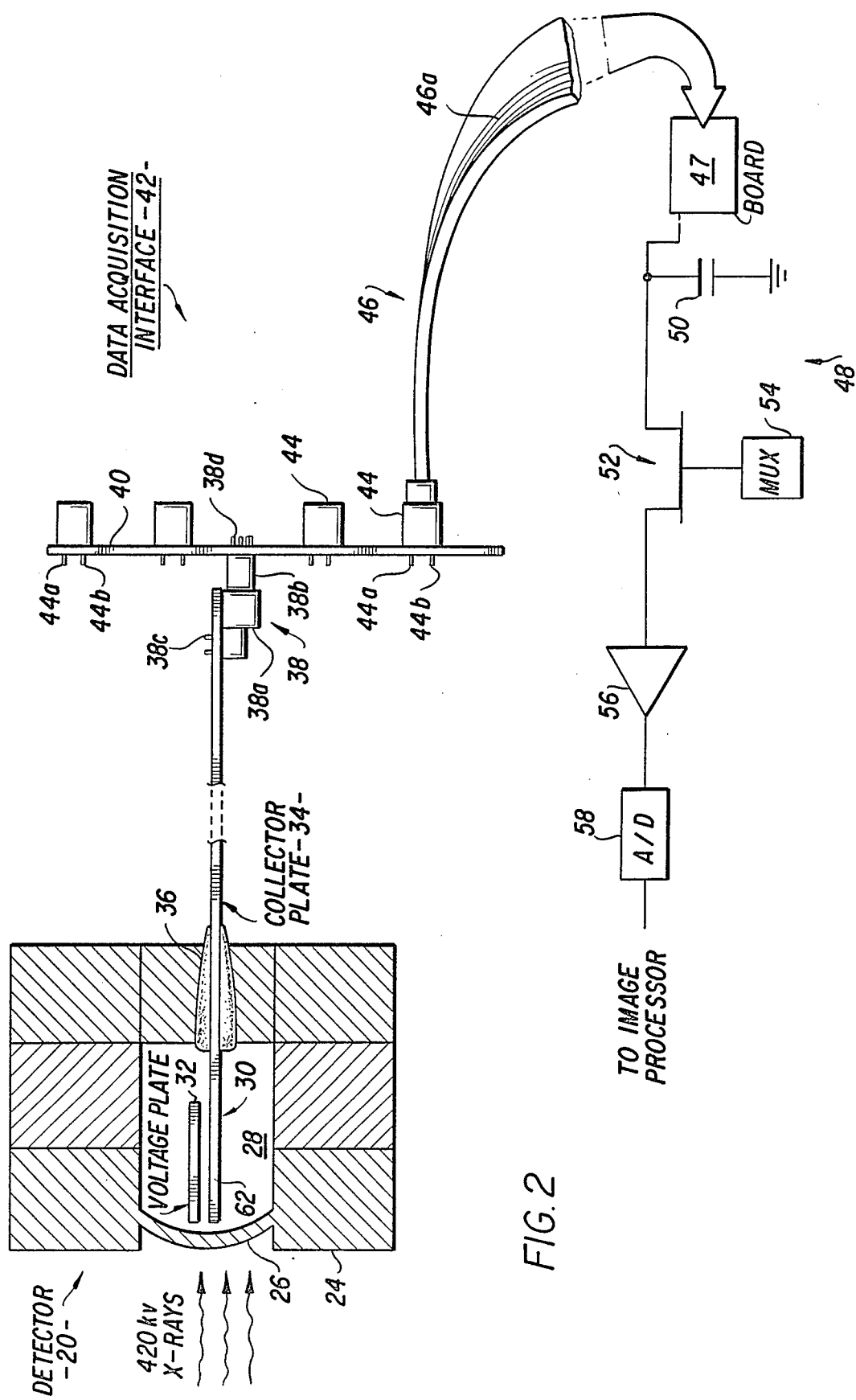
FIG. 2 is a schematic diagram of a part of the system shown in FIG. 1.

FIG. 2 shows the ionization detector 20 receiving X-rays of 420 kv, for example, from the source of FIG. 1. The ionization detector 20 has an X-ray impermeable housing 24 with an elongated slot or window 26 which is permeable to the X-rays passing through the slot. These X-rays pass through the window 26 and enter a sealed chamber 28. The chamber 28 contains a pressurized gaseous dielectric, such as xenon, and encloses a voltage plate 32 and part of a collector plate 34. X-rays passing through the window 26 ionize the gaseous dielectric. Charge created by the ionization of the gaseous dielectric between the collector and voltage plates is swept to the collector plate 34 by an electric field applied between plates 32 and 34. The amount of charge deposited on the collector plate 34 in a given time is related to the intensity of the X-rays passing through the window.

The collector plate is a dielectric substrate in the form of a printed circuit board onto which is deposited a number of conductive detector traces 64 which are elongated and generally parallel to each other. They are situated perpendicular to the plane of window 26 and in a line across the width of window 26. Charge created during the ionization of the gaseous dielectric in chamber 28 is deposited on those traces and conducted out of the chamber to a data acquisition system and image processor. The detector elements thus conduct signals representing the intensity of electromagnetic energy entering the chamber as a function of position along the width of the window 26.

Figure 3:
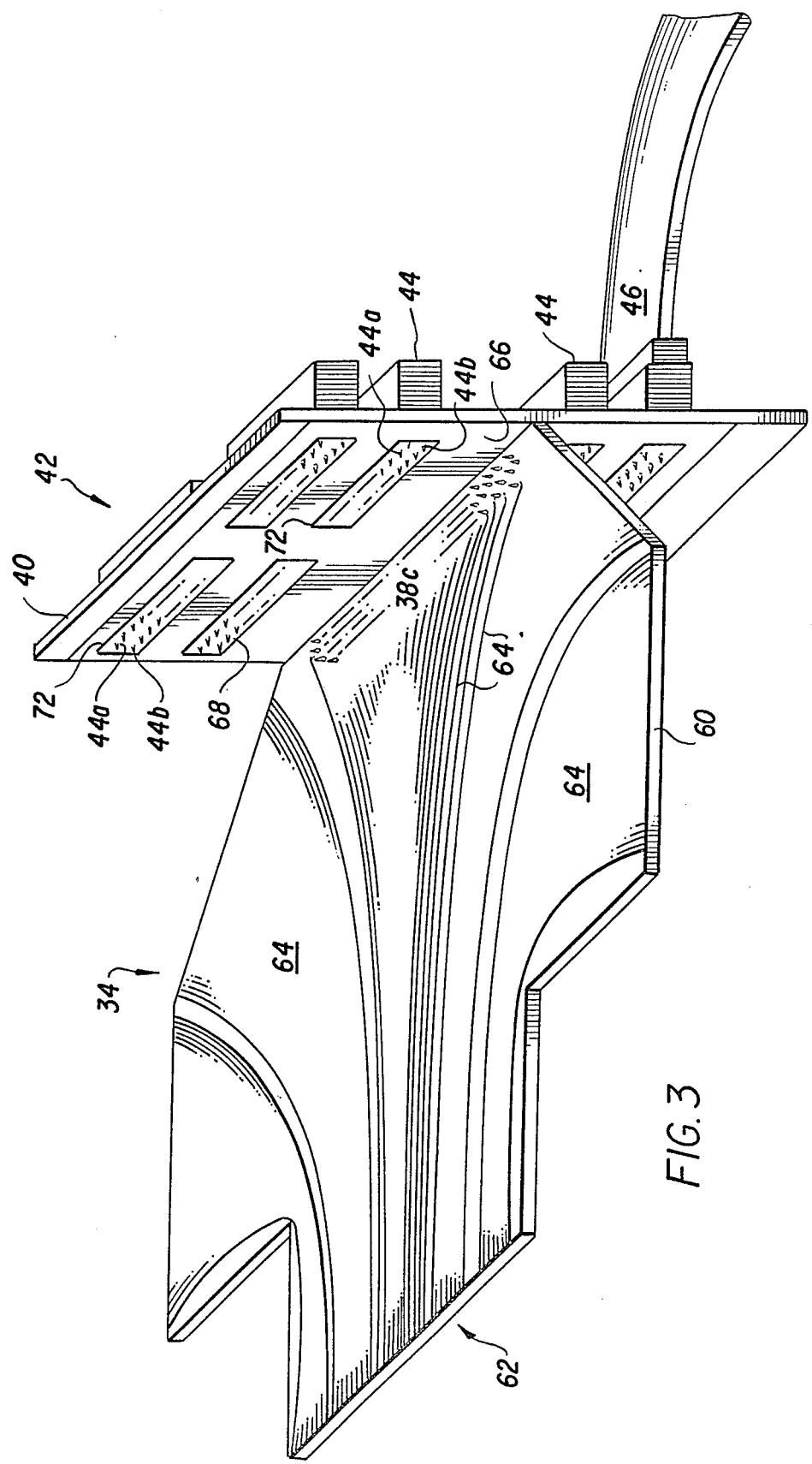
FIG. 3 shows the attachment of the FIG. 2 collector plate to one side of the FIG. 2 interface board.

The collector plate passes through the housing 24. An epoxy seal 36 insulates the collector plate 34 from the housing 24. A male member 38a of a high density connector 38 is connected to some of the detector traces 64 at one edge of the collector plate outside the chamber. The high density connector may be a 128 pin receptacle, Part No. 530720-9, manufactured by AMP. As shown in FIG. 3, the collector plate has five such edges, each of which has a high density connector. Only one such connector is shown in FIG. 3, for clarity. A female member 38b of the high density connector 38 is plugged into male member 38a and is mounted on one side of a substrate 40 forming a printed circuit interface board which is a part of a data acquisition interface 42. Ribbon connectors 44 are mounted on the other side of substrate 40. Ribbon cables 46, with a data channel 46a for each of the traces connected to the high density connector, are plugged into the ribbon connectors 44. Each of the ribbon connectors may be a 34 pin connector, Part No. 87478-5, manufactured by AMP. Inspection data is carried by the ribbon cables 46 through a printed circuit board 47 to a sampling circuit 48 comprising a capacitor 50 and FET 52 for each of the data channels 46a. Only one capacitor 50 and FET 52 are shown in FIG. 2. One example of a sampling circuit is an Analogic 640 channel Data Acquisition System.

Current generated in response to the ionization taking place in chamber 28 charges a capacitor 50. The FET 52 is connected to a multiplexer 54 which switches the FET 52 on at predetermined times. The FET 52, when switched on, discharges the capacitor 50. The FET's output is amplified by an amplifier 56 and is converted to a digital signal by an analog to digital converter 58. This digital signal is processed into a visual image of the part under examination. One means for processing such a visual image is discussed in U.S. patent application Ser. No. 832,511. The sampling circuit 48 comprises other like capacitors 50 which accumulate charge deposited on their respective detector elements and other like FET's 52 which are periodically switched on by the multiplexer 54 to discharge accumulated charge on each of the detector elements into amplifier 56 and analog to digital converter 58.

FIG. 3 shows connection of the collector plate 34 to one of the substrates 40. The collector plate 34 has a flared surface to allow the closely spaced detector traces 64 to spread sufficiently for connection to high density connectors located at edges 60. A flange 62 on the collector plate is positioned in the detector housing 24, as shown in FIG. 2. Conductive detector traces 64 made of nickel, for example, are deposited on top of the collector plate 34. These traces 64 extend from the front edge of flange 62 to each of the edges 60 to mounting pins 38c of the high density connector female member 38a.

Charges collected on the collector plate 34 are conducted by the detector traces from the flange 62 to the edges 60. The charge passes to the substrate 40 through the high density connector 38. A conductive film 66 made of gold, for example, is deposited on the high density connector side of substrate 40. The deposited film 66 is connected to an electrical ground. Windows 68 are defined in the grounded film 66 on the substrate 40. The ribbon connectors 44 are mounted on the other side of the substrate 40 directly opposite the windows 68. Mounting pins 44a and 44b of the ribbon connectors 44 pass through holes in the substrate 40 and are brazed to the substrate. One row of pins 44a of each ribbon connector 44 is joined by a trace 72 to the ground film 66.

Figure 4:
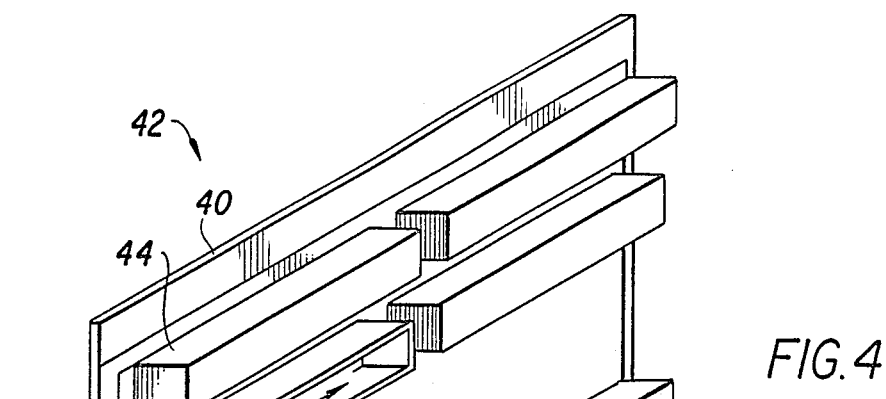
FIG. 4 shows the side of the FIG. 3 interface board having ribbon cable connectors.

FIG. 4 shows the ribbon connector side of the substrate 40. Eight ribbon connectors 44, for example, are mounted in four rows on the substrate 40 and are surrounded by a grounded film 82. Mounting pins 38d of the female member 38b of the high density connector extend through the substrate 40 and are connected to pins 44b of the ribbon connectors by conductive traces 78 and 80. A threaded nut 84 secures the high density connector male member 38b to the substrate 40.

Figure 5:
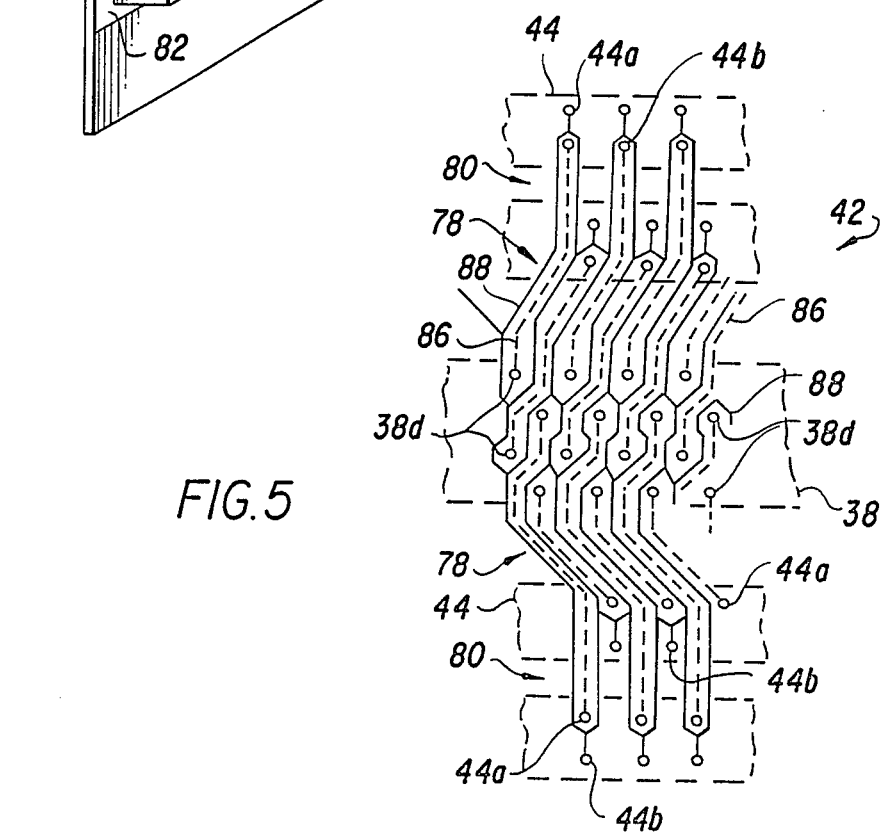
FIG. 5 shows in greater detail a portion of the interface board of FIG. 4.

FIG. 5 shows in greater detail a portion of the conductive traces 78 and 80. The ribbon connectors 44 are shown in phantom. The high density connector 38 on the other side of the substrate 40 is also shown in phantom. Conductive detector traces 86 are deposited on the substrate 40 and join each pin 44b of the ribbon connectors to a corresponding pin 38d of the high density connector 38. For clarity, the detector traces 86 are shown with dashed lines. Grounded traces 88 are deposited between and around the detector traces 86. Thus, each detector trace 86 is isolated from each of the other detector traces 86 by grounded trace 88. In other words, an alternating series of conductive detector traces 86 and conductive grounded traces 88 is provided. Typically, these detector and ground traces are approximately five to seven mils wide and are approximately five mils apart. The detector and ground traces may be deposited on the substrates in a manner described in U.S. Pat. No. 4,570,071.

The separation of the detector traces 86 by grounded traces 88 minimizes the distortion created by interference between the detector traces. The grounded traces 88 adjacent the detector traces 86 substantially reduce electrical cross talk between detector traces resulting from electrical fields created by current flowing in the detector traces 86. Also, the grounded traces 88 reduce charge leakage from one detector trace 86 to another. Any leaking charges are carried by a grounded trace 88 to an electrical ground. Finally, the distortion caused by contamination and humidity are also reduced. Thus, distortion of the image of the part 12 is minimized.

Figure 6:
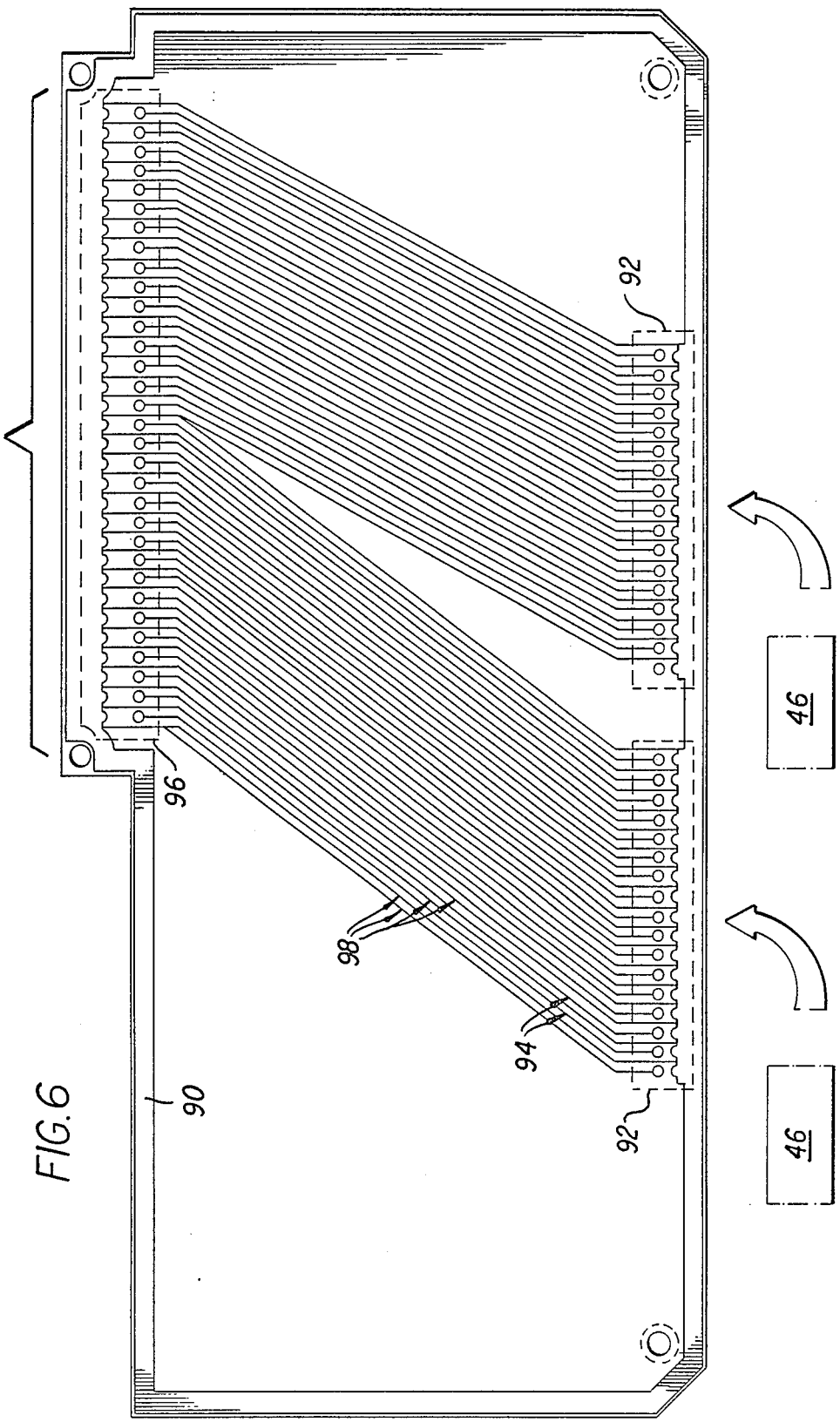
FIG. 6 shows in greater detail the circuit board of FIG. 2.

FIG. 6 shows in greater detail the circuit board 47 of FIG. 2. That circuit board is used to provide an interface between the ribbon cables 46 and connectors on the Analogic Data Acquisition System mentioned above. The circuit board is a dielectric substrate onto which is deposited a grounded conductor 90 around the edges. The ribbon cables are plugged into ribbon connectors 92 on one edge of the circuit board. The ribbon connectors connect each data channel 46a to a signal trace 94 deposited on the substrate. The signal traces connect the data channels to a data acquisition system connector 96 at the opposite edge of the circuit board. Connector 96 connects the circuit board 47 to the data acquisition system such that each data channel 46a is connected to a respective capacitor 50 and FET 52 combination as described above. Ground traces 98 are deposited on the substrate in the spaces between the signal traces 94 and are connected to the grounded conductor 90.

Although grounded conductive traces have been shown for only the interface printed circuit boards 40 and 47, they may be applied to any substrates having conductive signal carrying elements where signal distortion is a concern. For example, conductive detector elements carrying low level signals in the pico- to micro-ampere range and the micro- to milli-volt range can be provided with grounded conductive elements to minimize this problem. The collector plate 34, for instance, can have such grounded conductive elements adjacent or between each signal carrying element. Also, any single detector element can have an adjacent grounded element, or can be surrounded by such an element, to reduce the distortion caused by stray charge or fields, contamination, or electrical interference.

I claim:
1. An ionization detector comprising:
a substrate;
one or more conductive detector elements deposited on one or more sides of the substrate; and
one or more grounded conductive elements deposited on one or more sides of the substrate having the conductive detector elements, the grounded conductive elements being adjacent at least one of the detector elements for reducing distortion of signals carried by the detector elements.

2. The ionization detector of claim 1, in which the one or more conductive detector elements comprise a plurality of elongated signal traces spaced on the substrate; and the one or more grounded conductive elements comprise a plurality of elongated grounded traces in the spaces between the detector traces.

3. The ionization detector of claim 2, in which the grounded traces surround each of the signal traces.

4. The ionization detector of claim 1, in which the substrate comprises:

a collector plate extending at least partly into a sealed chamber containing a pressurized gaseous dielectric; and one or more interference printed circuit boards connected to the collector plate.

5. The ionization detector of claim 1, in which the grounded elements surround the detector elements.

6. The ionization detector of claim 1, in which part of the substrate extends into a sealed chamber containing a pressurized gaseous dielectric, the grounded conductive elements being deposited on the substrate outside the chamber.

7. The ionization detector of claim 4, in which the grounded elements are outside the chamber on one or more of the interface printed circuit boards.

8. The ionization detector of claim 4, in which the grounded elements are on the collector plate.

9. The ionization detector of claim 1, in which the one or more grounded conductive elements are adjacent to the one or more detector elements for reducing the effects of stray charge or fields, contamination, or electrical interference on the signals carried by the one or more detector elements.

10. The ionization detector of claim 1, in which the or more grounded conductive elements are adjacent to the one or more detector elements for reducing the effects of electrical cross talk between the detector elements, charge leakage between the detector elements, contamination, or humidity on the signals carried by the one or more detector elements.

11. The ionization detector of claim 1, in which part of the substrate having one or more detector elements extends into a sealed chamber containing gaseous dielectric and having a window for admitting electromagnetic energy into the chamber; and in which the detector elements are elongated traces spaced on the substrate, the direction of elongation of the detector elements in the chamber being generally parallel to the direction in which the electromagnetic energy enters the chamber.

12. The ionization detector of claim 11, further comprising a voltage plate situated in the chamber for creating an electric field across the gaseous dielectric between the voltage plate and the detector elements.

13. An ionization detector, comprising:
a substrate;
a plurality of conductive detector elements deposited on one of the sides of the substrate; and
a plurality of grounded conductive elements deposited on the side of the substrate having the conductive detector elements, the grounded conductive elements being adjacent the conductive detector elements for reducing distortion of signals carried by the detector elements.

14. The ionization detector of claim 13, in which the plurality of conductive elements comprises a plurality of elongated signal traces spaced on the substrate; and the plurality of grounded conductive elements comprises a plurality of elongated grounded traces in the spaces between the detector traces.

15. The ionization detector of claim 13, in which the grounded elements surround the detector elements.

16. The ionization detector of claim 14, in which the grounded elements surround the detector elements.

17. The ionization detector of claim 13, in which the substrate comprises:

a collector plate, part of which extends into a sealed chamber containing a pressurized gaseous dielectric; and one or more interface printed circuit boards connected to the collector plate.

18. The ionization detector of claim 13, in which the substrate partly extends into a sealed chamber containing a pressurized gaseous dielectric, the grounded conductive elements being located on the substrate outside the sealed chamber.

19. The ionization detector of claim 17, in which the grounded elements are located outside the chamber on an interface circuit board.

20. The ionization detector of claim 17, in which the grounded elements are on the collector plate.

21. The ionization detector of claim 13, in which the plurality of grounded conductive elements are adjacent to the plurality of detector elements for reducing the effects of stray charge or fields, contamination, or electrical interference on the signals carried by the detector elements.

22. The ionization detector of claim 13, in which the plurality of grounded conductive elements are adjacent to the plurality of detector elements for reducing the effects of electrical cross talk between the detector elements, charge leakage between the detector elements, contamination, or humidity on the signals carried by the detector elements.

23. The ionization detector of claim 13, in which part of the substrate having the plurality of detector elements extends into a sealed chamber containing gaseous dielectric and having a window for admitting electromagnetic energy into the chamber; and in which the detector elements are elongated traces spaced on the substrate, the direction of elongation of the detector elements in the chamber being generally parallel to the direction in which the electromagnetic energy enters the chamber.

24. The ionization detector of claim 23, further comprising a voltage plate situated in the chamber for creating an electric field across the gaseous dielectric between the voltage plate and the detector elements.

25. The ionization detector of claim 13, in which each of the plurality of grounded conductive elements is adjacent a respective detector element for reducing the effects of stray charge or fields, contamination, or electrical interference on the signals carried by that detector element.

26. The ionization detector of claim 13, in which each of the plurality of grounded conductive elements is adjacent to a respective detector element for reducing the effects of electrical cross talk between the detector elements, charge leakage between the detector elements, contamination, or humidity on the signals carried by that detector element.

* * * * *